(12) United States Patent
Nakajima et al.

(10) Patent No.: US 7,667,274 B2
(45) Date of Patent: Feb. 23, 2010

(54) SEMICONDUCTOR DEVICE AND METHOD OF MANUFACTURING THE SAME

(75) Inventors: Kazuaki Nakajima, Kamakura (JP); Kyoichi Suguro, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 35 days.

(21) Appl. No.: 12/071,887

(22) Filed: Feb. 27, 2008

(65) Prior Publication Data

US 2008/0157214 A1 Jul. 3, 2008

Related U.S. Application Data

(62) Division of application No. 10/701,435, filed on Nov. 6, 2003, now Pat. No. 7,354,819.

(30) Foreign Application Priority Data

Nov. 7, 2002 (JP) .............................. 2002-323493

(51) Int. Cl.
*H01L 29/45* (2006.01)
*H01L 29/78* (2006.01)

(52) U.S. Cl. ............... 257/382; 257/384; 257/E27.062; 257/E29.064

(58) Field of Classification Search ................. 257/382, 257/384, E27.062, E29.064
See application file for complete search history.

(56) References Cited

U.S. PATENT DOCUMENTS 5,202,275 A 4/1993 Sugiura et al.
5,705,826 A * 1/1998 Aratani et al. ................. 257/40
6,465,887 B1 10/2002 Chu et al.
7,459,756 B2 * 12/2008 Lin et al. ..................... 257/384
2003/0162389 A1 * 8/2003 Wieczorek et al. .......... 438/664
2006/0220141 A1 * 10/2006 Besser ........................ 257/371

FOREIGN PATENT DOCUMENTS

| JP | 11-214650 | 8/1999 |
| JP | 2000-286411 | 10/2000 |
| JP | 2001-250792 | 9/2001 |
| JP | 2002-094058 | 3/2002 |
| JP | 2002-198325 | 7/2002 |

OTHER PUBLICATIONS

Machine Translation of JP 2002-094058, 44 pages.*
Notification of Reasons for Rejection dated Apr. 22, 2005, issued by the Japanese Patent Office in counterpart Japanese Application No. 2002-323493.

* cited by examiner

*Primary Examiner*—Evan Pert
(74) *Attorney, Agent, or Firm*—Finnegan, Henderson, Farabow, Garrett & Dunner, L.L.P.

(57) ABSTRACT

A semiconductor device is disclosed, which comprises a silicon substrate, a complementary MISFET circuit, an insulation film formed on the silicon substrate, a first contact hole formed in the insulation film, a first metal silicide layer formed on the bottom of the first contact hole, the first metal silicide layer being provided by a reaction of the n-channel impurity diffused region of the n-channel MISFET with a first metal, a second contact hole formed in the insulation film, a second metal silicide layer formed on the bottom of the second contact hole, the second metal silicide layer being provided by a reaction of the p-channel impurity diffused region of the p-channel MISFET with a second metal, and a work function of the second metal silicide layer being higher than that of the first metal silicide layer.

12 Claims, 7 Drawing Sheets

SEMICONDUCTOR DEVICE AND METHOD OF MANUFACTURING THE SAME

CROSS-REFERENCE TO RELATED APPLICATIONS

This application is a divisional of U.S. patent application Ser. No. 10/701,435, filed Nov. 6, 2003 now U.S. Pat. No. 7,354,819 and claims the benefit of priority from the prior Japanese Patent Application No. 2002-323493, filed Nov. 7, 2002, the entire contents of which are incorporated herein by reference.

BACKGROUND OF THE INVENTION

1. Field of the Invention

The present invention relates to a semiconductor device of a CMOS structure having a fine contact and a method of manufacturing the same.

2. Description of the Related Art

Decrease of parasitic resistance becomes a larger problem as miniaturization of the semiconductor device is enhanced. However, in the fine contact, it has been difficult to reduce the contact resistance in accordance with the scaling.

In order to obtain a good contact to a semiconductor substrate in a bottom surface of the contact, titanium silicide has been conventionally formed on the bottom surface of a contact hole by sputtering, plasma CVD and the like (pages 5 and 6 and FIGS. 10 and 12 of Jpn. Pat. Appln. KOKAI Publication No. 11-214650, and pages 6 and 7 and FIG. 7 of Jpn. Pat. Appln. KOKAI Publication No. 2001-250792). This treatment deoxidizes a native oxide film on a surface of the semiconductor substrate in which the bottom surface of the contact hole is present. The native oxide film forms most part of the contact resistance. However, it is not sufficient in order to further decrease of the contact resistance.

Generally, a relationship between a work function $\phi m$ of a metal and a work function $\phi s$ of a semiconductor determines which of Schottky junction and ohmic junction is created at an interface between the metal and semiconductor. For example, when an n-type semiconductor is in contact with a metal, the metal/semiconductor interface has the Schottky junction if $\phi m > \phi s$, while the metal/semiconductor interface has the ohmic contact if $\phi m < \phi s$. On the other hand, when a p-type semiconductor is in contact with a metal, the metal/semiconductor interface has the ohmic junction if $\phi m > \phi s$, while the metal/semiconductor interface has the Schottky contact if $\phi m < \phi s$. The work function $\phi s$ of the semiconductor is changed by an impurity concentration, the work function $\phi s$ is in the range of about 4.0 eV to 4.2 eV in the case of the n-type semiconductor, and the work function $\phi s$ is in the range of about 4.9 eV to 5.1 eV in the case of the p-type semiconductor. Therefore, in the case that a metal is in contact with both the n-type semiconductor and the p-type semiconductor, one of the contacts has the ohmic junction and the other contact has the Schottky junction.

A metal has been commonly used in forming both a contact to an n-type semiconductor and a contact to a p-type semiconductor. Since the work function of titanium silicide, which is usually used, is 4.1 eV, then the contact has the ohmic contact to the n-type semiconductor, while the contact has the Schottky junction (i.e., non-ohmic contact) to the p-type semiconductor. Accordingly, the contact resistance on the p-type semiconductor region (i.e., the resistance between the titanium silicide and the p-type semiconductor region) becomes higher than that on the n-type semiconductor region (i.e., the resistance between the titanium silicide and the n-type semiconductor region).

As a matter of course, in order to decrease the contact resistance, it is desirable that both of the contacts have the ohmic junction. To attain such contacts, for example, a contact hole to the n-type semiconductor is formed, and then a contact layer of metal A satisfying the relationship of $\phi m < \phi s$ is formed in the contact hole. Further, a contact hole to the p-type semiconductor is formed, and then a contact layer of metal B satisfying the relationship of $\phi m > \phi s$ is formed in the contact hole. However, in order to realize such a forming method, it is necessary to establish a technique including, e.g. the sputtering, plasma CVD technique and the like, for embedding at least two kinds of metals into the inside of the fine contact. Further, two processes are required to be carried out to form the contacts, and thus the number of processes required increases. Accordingly, it has not been easy to form a contact having the ohmic junction to the n-type semiconductor and the p-type semiconductor.

BRIEF SUMMARY OF THE INVENTION

According to an aspect of the present invention, there is provided a semiconductor device comprising:

a silicon semiconductor substrate;

a complementary type MISFET circuit including an n-channel MISFET and a p-channel MISFET, which are formed on a surface region of the silicon semiconductor substrate;

an insulation film formed on the surface region of the silicon semiconductor substrate in which the complementary type MISFET circuit is formed;

a first contact hole formed in the insulation film, an n-channel impurity diffused region of the n-channel MISFET being exposed at a bottom of the first contact hole;

a first metal silicide layer formed on the bottom of the first contact hole, the first metal silicide layer being provided by a reaction of the n-channel impurity diffused region with a first metal;

a second contact hole formed in the insulation film, a p-channel impurity diffused region of the p-channel MISFET being exposed at a bottom of the second contact hole;

a second metal silicide layer formed on the bottom of the second contact hole, the second metal silicide layer being provided by a reaction of the p-channel impurity diffused region with a second metal; and a work function of the second metal silicide layer being higher than that of the first metal silicide layer.

According to another aspect of the present invention, there is provided a method of manufacturing a semiconductor device comprising:

forming a complementary type MISFET circuit including an n-channel MISFET and a p-channel MISFET on a surface region of a silicon semiconductor substrate;

forming an insulation film on the silicon semiconductor substrate in which the complementary type MISFET circuit is formed;

forming a first contact hole and a second contact hole in the insulation film, an n-channel impurity diffused region of the n-channel MISFET being exposed at a bottom of the first contact hole, a p-channel impurity diffused region of the p-channel MISFET being exposed at a bottom of the second contact hole;

forming a first conductive layer on the bottom of the second contact hole;

forming a second conductive layer on the first and second contact holes;

heating the silicon semiconductor substrate to cause the second conductive layer react with the n-channel impurity diffused region to provide a first metal silicide layer at the bottom of the first contact hole and to cause the first and second conductive layers react with the p-channel impurity diffused region to provide a second metal silicide layer at the bottom of the second contact hole;

in which a work function of the second metal silicide layer is higher than that of the first metal silicide layer.

According to a further aspect of the present invention, there is provided a method of manufacturing a semiconductor device comprising:

forming a complementary type MISFET circuit including an n-channel MISFET and a p-channel MISFET on a surface region of a silicon semiconductor substrate;

forming an insulation film on the surface of the silicon semiconductor substrate in which the complementary type MISFET circuit is formed;

forming a first contact hole and a second contact hole in the insulation film, an n-channel impurity diffused region of the n-channel MISFET being exposed at a bottom of the first contact hole, a p-channel impurity diffused region of the p-channel MISFET being exposed at a bottom of the second contact hole;

forming a first conductive layer formed on the bottoms of the first and second contact holes;

forming a second conductive layer on the first conductive layer formed on the bottom of the second contact hole; and heating the silicon semiconductor substrate to cause the first conductive layer on the bottom of the first contact hole react with the n-channel impurity diffused region to provide a first metal silicide layer at the bottom of the first contact hole, and to cause the first and second conductive layers react with the p-channel impurity diffused region to provide a second metal silicide layer at the bottom of the second contact hole;

in which a work function of the second metal silicide layer is higher than that of the first metal silicide layer.

According to a still further aspect of the present invention, there is provided a method of manufacturing a semiconductor device comprising:

forming a complementary type MISFET circuit including an n-channel MISFET and a p-channel MISFET on a surface region of a silicon semiconductor substrate;

forming an insulation film on the surface of the silicon semiconductor substrate in which the complementary type MISFET circuit is formed;

forming a first contact hole and a second contact hole in the insulation film, an n-channel impurity diffused region of the n-channel MISFET being exposed at a bottom of the first contact hole, a p-channel impurity diffused region of the p-channel MISFET being exposed at a bottom of the second contact hole;

forming a first conductive layer formed on the bottom of the first contact hole;

forming a second conductive layer in the first contact hole in which the first conductive layer is formed on the bottom of the first contact hole, and in the second contact hole; and heating the silicon semiconductor substrate to cause the first and second conductive layers in the first contact hole react with the n-channel impurity diffused region to provide a first metal silicide layer at the bottom of the first contact hole, and to cause the second conductive layer react with the p-channel impurity diffused region to provide a second metal silicide layer at the bottom of the second contact hole;

in which a work function of the second metal silicide layer is higher than that of the first metal silicide layer.

DETAIL DESCRIPTION OF THE INVENTION

Referring to the accompanying drawings, several embodiments of the present invention will be described hereinbelow.

A first embodiment of the present invention will be described below referring to FIGS. 1 to 5.

Figure 1:
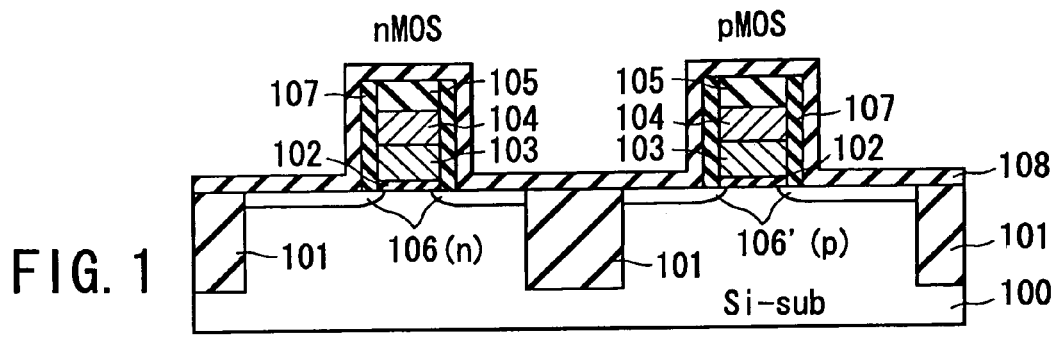
FIG. 1 is a sectional view of a semiconductor device, explaining a step of a manufacturing method according to a first embodiment of the present invention.
Figure 2:
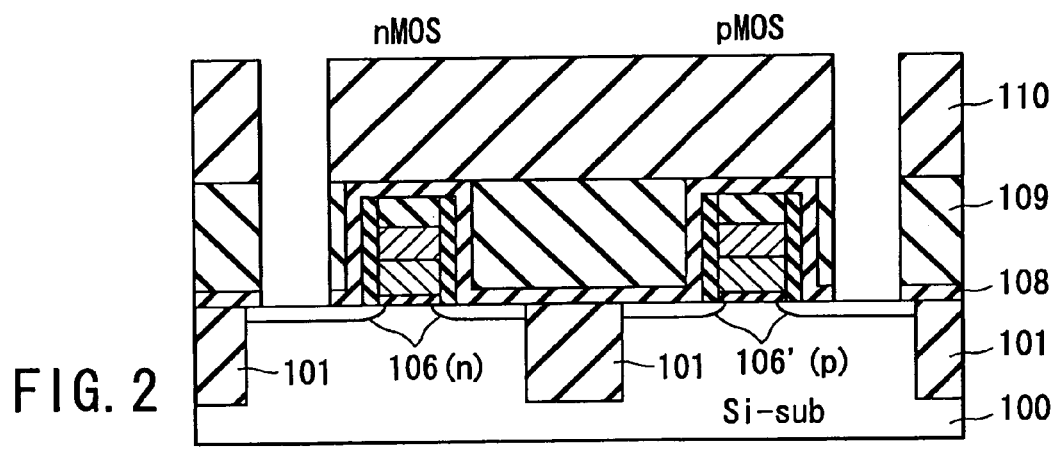
FIG. 2 is a sectional view of the semiconductor device, explaining a step following the step of FIG. 1 of the manufacturing method according to the first embodiment of the present invention.
Figure 3:
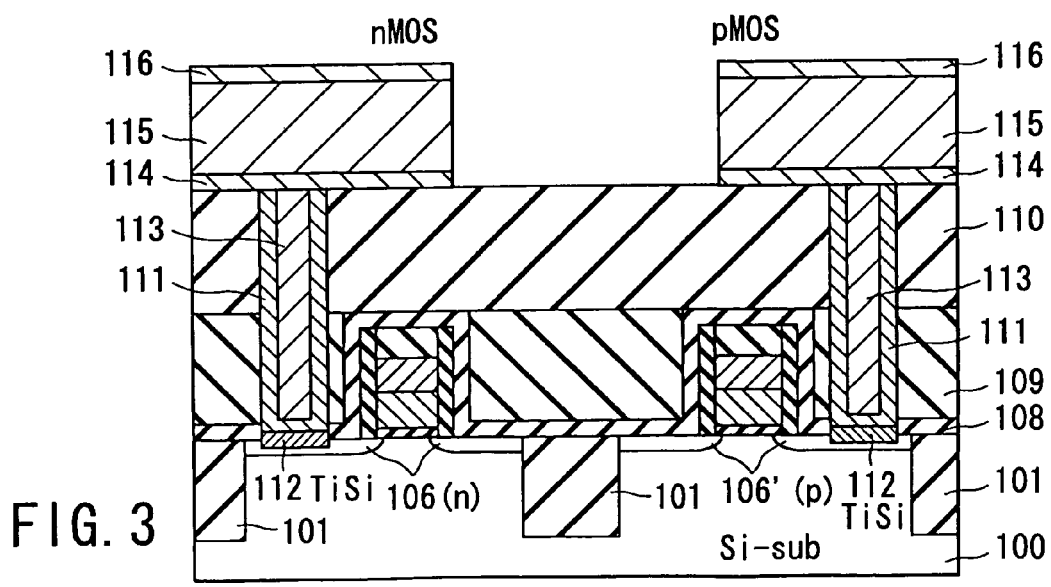
FIG. 3 is a sectional view of the semiconductor device, explaining a step of a conventional manufacturing method, which is carried out after the step of FIG. 2.

FIGS. 1, 2, 4 and 5 are sectional views of a semiconductor device of a CMOS structure, explaining the steps of a manufacturing method according to the first embodiment, and FIG. 3 is a sectional view of the semiconductor device, explaining a step of a conventional manufacturing method, which is carried out after the step of FIG. 2.

First, as shown in FIG. 1, a gate insulating film 102 such as a silicon oxide film is formed on a surface of a single crystal silicon semiconductor substrate 100 in which an element isolating region 101 is formed by, for example, STI (Shallow Trench Isolation).

A polycrystalline silicon film 103 is deposited on the gate insulating film 102 by, e.g. CVD (Chemical Vapor Deposition) method. A superposed W/WN$_X$ film 104 is formed on the polycrystalline silicon film 103 by sputtering. A silicon nitride film 105 is formed on the superposed W/WN$_X$ film 104 by CVD.

The silicon nitride film 105, the superposed W/WN$_X$ film 104, and the polycrystalline silicon film 103 are etched into a pattern by an anisotropic etching such as RIE (Reactive Ion Etching) to form gate electrodes each including the polycrystalline silicon film 103 and the superposed W/WN$_X$ film 104.

N-type impurity diffusion regions (source/drain region) 106 are formed in an NMOS (N-channel MOS) region of the surface region of the single crystal silicon semiconductor substrate 100, and p-type impurity diffusion regions (source/drain region) 106' are formed in a PMOS (P-channel MOS) region of the surface region of the single crystal silicon semiconductor substrate 100, respectively, by implanting As$^+$ ions, for example, into the NMOS region, and B$^+$ ions, for example, into the PMOS region, and carrying out a heat treatment at 900° C. for 5 seconds.

Further, a silicon nitride film (SiN) 107 is deposited over the surface of the silicon semiconductor substrate 100 to cover the gate electrodes, and then the silicon nitride film 107 is etched back to have a pattern in which a sidewall of each of the gate electrodes is surrounded by the silicon nitride film 107.

A silicon nitride film (SiN) 108 is deposited over the surface of the silicon semiconductor substrate to cover the gate electrodes (FIG. 1).

Then, as shown in FIG. 2, an interlayer insulating film 109 such as a silicon oxide film is deposited over the surface of the silicon nitride film 108, and then the interlayer insulating film 109 is planarized by, e.g. CMP (Chemical Mechanical Polishing) method until the surface of the silicon nitride film 108 is exposed.

An interlayer insulating film 110 such as a silicon oxide film is deposited over the silicon nitride film 108 and the interlayer insulating film 109.

The interlayer insulating films 110 and 109 and the silicon nitride film 108 are anisotropically etched using as a mask a resist pattern, not shown, formed on the interlayer insulating films 110, to form contact holes leading to the impurity diffusion regions 106 and 106' (FIG. 2).

After that, in a conventional manufacturing method, as shown in FIG. 3, a Ti film 111 having a thickness of, e.g. about 30 nm, is formed over the semiconductor substrate 100 to cover the interlayer insulating films 109 and 110 by sputtering. A heat treatment, e.g. at 550° C. for about 60 minutes, is carried out in an H$_2$/N$_2$ atmosphere to nitride the surface of the titanium film 111 and also to form titanium silicide layers 112 on the bottom surface of the contact holes.

A W (tungsten) film 113 is formed over the titanium film 111 and in the contact holes, using WF$_6$, SiH$_4$, and hydrogen as reaction gas. In this way, contact layers having titanium silicide bottom portions 112 are formed in the NMOS/PMOS regions.

After that, the W film 113 and the Ti film 111 are polished by CMP until the surface of the interlayer insulating film 110 is exposed. Then, a titanium nitride film (TiN) 114, an Al film 115 and a titanium nitride film (TiN) 116 are formed in the order over the interlayer insulating films 110, the Ti film 111 and the W film 113. After that, the titanium nitride film 114, the Al film 115 and the titanium nitride film 116 are subjected to an anisotropic etching to form wiring layers having a predetermined pattern. In this way, the NMOSFET/PMOSFET are connected to the wiring layers via the contact layers.

Since the work function of titanium silicide is 4.0 eV, then titanium silicide has ohmic contact to an n-type semiconductor region. On the other hand, since titanium silicide has non-ohmic contact (Schottky junction) to a p-type semiconductor region, then the contact resistance on the p-type impurity diffusion region 106' is larger than that on the n-type impurity diffusion region 106, and this is undesirable (FIG. 3).

Figure 4:
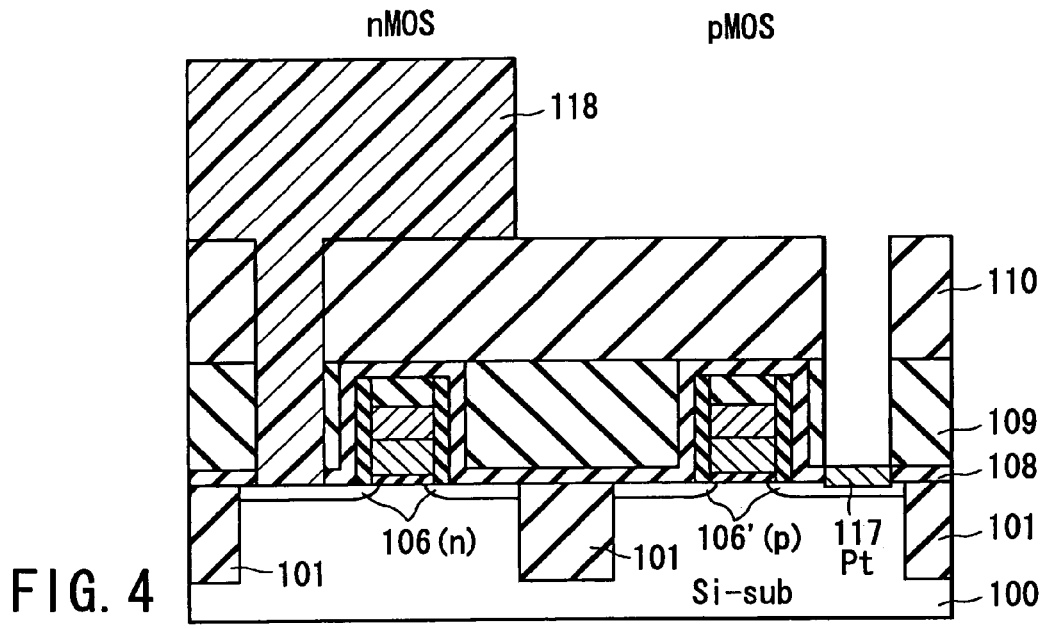
FIG. 4 is a sectional view of the semiconductor device, explaining a step following the step of FIG. 2 of the manufacturing method according to the first embodiment of the present invention.
Figure 5:
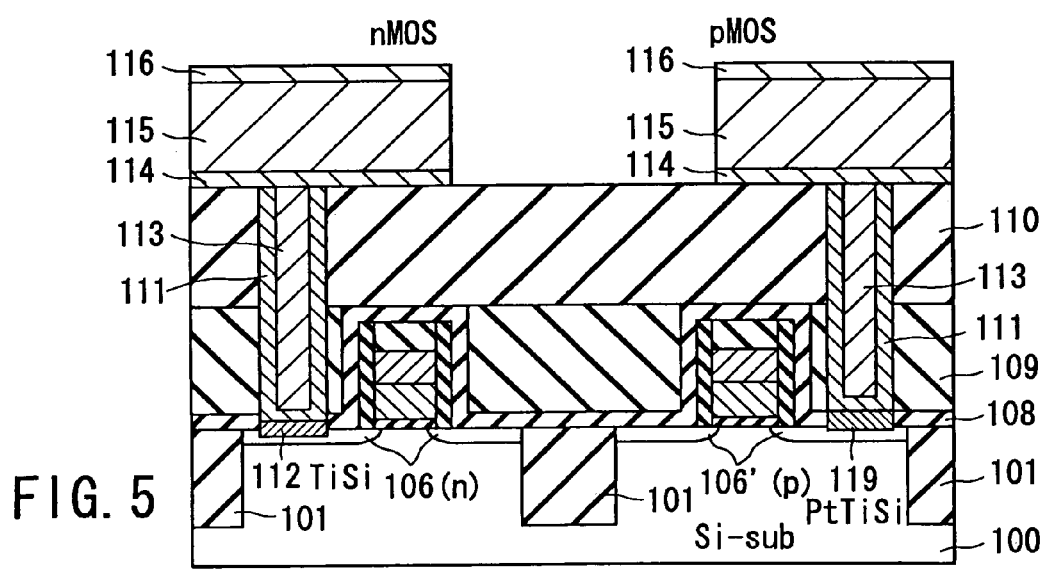
FIG. 5 is a sectional view of the semiconductor device, explaining a step following the step of FIG. 4 of the manufacturing method according to the first embodiment of the present invention.

In the method according to this embodiment, the step of FIG. 3 of the conventional method is not carried out, and steps to be described with reference to FIGS. 4 and 5 are performed after the step of FIG. 2. Thus, the method of the present embodiment is free of the above-described disadvantages of the conventional method.

In the present embodiment, after forming the contact holes leading to the impurity diffusion regions 106 and 106' (FIG. 2), a platinum (Pt) film 117 is formed on the bottom surface of the contact hole in the PMOS region, while the contact hole of the NMOS region is covered with a resist pattern 118, as shown in FIG. 4. The Pt film 117 is provided by carrying out electroless plating using ammonium platinum nitrite solution (Pt(NH$_3$)$_2$(NO$_2$)$_2$) as a plating solution on conditions that the temperature of a plating tank is in the range of 60 to 80° C. and pH of the plating solution is in the range of 1 to 4, while the contact hole in the NMOS region is covered with the resist pattern 118.

It is considered that the Pt film 117 on the bottom surface of the contact hole in the PMOS region may be formed by CVD or PVD (Physical Vapor Deposition). With this method, a Pt film is formed also on the resist pattern, which is made of an organic material. However, organic materials can hardly withstand against high temperature of 200° C. or more or plasma damage caused by a sputtered particle. Also, metal materials have generally bad adhesion properties to organic materials, and thus a metal material film easily peels from an organic material film.

Further, it is considered that the Pt film is formed over the exposed surface of the films formed on the semiconductor substrate. In this case, it is necessary to remove the Pt film formed in the NMOS region by dry etching or the like. However, halide of noble metals such as Pt has low vapor pressure, and thus it is difficult to carry out dry etching to remove the Pt film formed in the NMOS region. Patterning of noble metals may be carried out only by a technique physically flicking halide of the noble metals away like ion milling, and thus it is not easy to form the fine pattern (FIG. 4).

After forming the Pt film 117 on the bottom surface of the contact hole in the PMOS region by carrying out the electroless plating, the resist film 118 is removed. After removing the resist film 118, a Ti film 111 having a film thickness of, e.g. about 30 nm, is formed by sputtering over the surface of the semiconductor substrate.

Then, the heat treatment is carried out, e.g. at 550° C. for about 60 minutes in an $H_2/N_2$ atmosphere. With the heat treatment, the titanium silicide layer 112 is formed on the bottom surface of the contact hole in the NMOS region, while a silicide layer 119 of Pt and titanium is formed on the bottom surface of the contact hole in the PMOS region, as shown in FIG. 5.

Noble metals such as Pt can easily react with silicon even at a temperature of as low as about 400° C., and the noble metals have high diffusion coefficients in the silicon semiconductor substrate.

Further, it is also advantageous that the work function of Pt is as high as 5.0 eV. That is, since the work function of Pt is as high as 5.0 eV, then Pt exist at a high concentration in the boundary region of the semiconductor region/silicide layer. As a result, the work function of the PtTi silicide layer 119 becomes larger than that of titanium silicide layer 112.

After carrying out the heat treatment in the $H_2/N_2$ atmosphere, thus forming the titanium silicide layer 112 in the NMOS region and the Pt silicide layer 119 in the PMOS region, a W (tungsten) film 113 is formed over the titanium film 111 and in the contact holes, using $WF_6$, $SiH_4$, and hydrogen as reaction gas.

After that, the W film 113 and the Ti film 111 are polished by CMP until the surface of the interlayer insulating film 110 is exposed. In this way, contact layers having the titanium silicide layer 112 in the NMOS region and the PtTi silicide layer 119 in the PMOS region are formed in the NMOSFET/PMOSFET regions, respectively.

A titanium nitride film (TiN) 114, an Al film 115 and a titanium nitride film (TiN) 116 are formed in the order over the interlayer insulating films 110, the Ti film 111 and the W film 113. Then, the titanium nitride film 114, the Al film 115 and the titanium nitride film 116 are subjected to an anisotropic etching to form wiring layers having a predetermined pattern. In this way, the NMOSFET/PMOSFET are connected to the wiring layers via the contact layers (FIG. 5).

With the structure as described above, it is possible that the work function of the silicide layer of the bottom surface of the contact hole to the p-type semiconductor region (p-type impurity diffusion region 106') is made higher than of the work function of the silicide layer of the bottom surface of the contact hole to the n-type semiconductor region (n-type impurity diffusion region 106), so that the contact resistance on the p-type semiconductor region can be decreased without increasing the contact resistance on the n-type semiconductor region.

Further, since the opening of the contact is only one time in this embodiment, the work function of the silicide layer of the bottom surface of the contact hole to the p-type semiconductor region can be increased higher than the work function of the silicide layer of the bottom surface of the contact hole to the n-type semiconductor region, without increasing the number of processes.

Further, the Pt film may be formed only on the bottom surface of the contact hole. That is, it is unnecessary to embed Pt in the entire inside of the contact, so that a film embedding technique is not required.

In this embodiment, the Pt film is silicified at the same time when the titanium film formed after the Pt film is silicified. However, the Pt film silicification may be carried out before the titanium film silicification.

Further in this embodiment, ammonium platinum nitrite is used as metal salt of platinum. Instead, platinum ammonium chloride ($PtCl_6 \cdot (NH_4)_2$) and platinum chloride ($H_2PtCl_6$) may be used.

Also in the present embodiment, Pt is used as the material having the work function not lower than 4.8 eV. However, Pd, Ni, Co, W, Mo, Sb, Bi and a mixture of these materials may be used. In electroplating, the metal salt of the above-described metals, e.g. $(NH_3)_4Pt(NO_3)_2$, $PdCl_2$, $PdSO_4$, $NiCl_2$, $NiSO_4$, or $CoSO_4$ may be used as the plating solution.

Further, the Pt film is formed by the electroless plating in the embodiment, the electroplating may be used, instead.

A second embodiment of the present invention will be described below referring to FIGS. 6 to 13.

FIGS. 6 to 13 are sectional views of a semiconductor device of a CMOS structure, explaining steps of a manufacturing method of the second embodiment.

Figure 6:
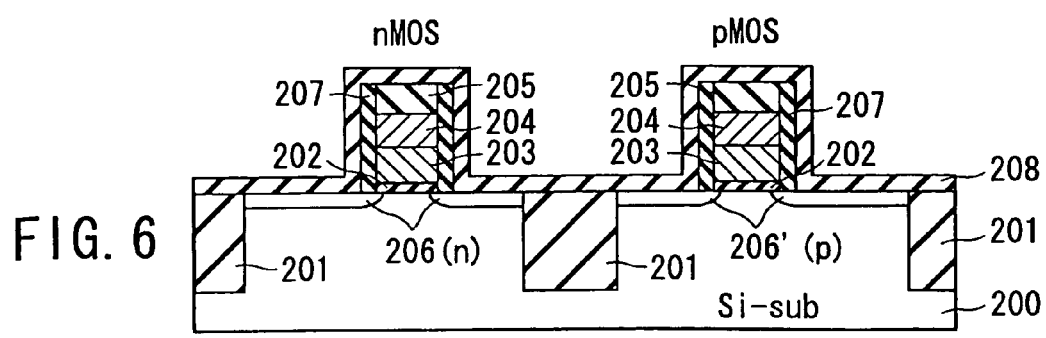
FIG. 6 is a sectional view of a semiconductor device, explaining a step of a manufacturing method according to a second embodiment of the present invention.

First, as shown in FIG. 6, a gate insulating film 202 such as a silicon oxide film is formed on a surface of a single crystal silicon semiconductor substrate 200 in which an element isolating region 201 is formed by, for example, STI (Shallow Trench Isolation).

A polycrystalline silicon film 203 is deposited on the gate insulating film 202 by, e.g. CVD (Chemical Vapor Deposition) method. A superposed W/$WN_X$ film 204 is formed on the polycrystalline silicon film 203 by sputtering. A silicon nitride film 205 is formed on the superposed W/$WN_X$ film 204 by CVD.

The silicon nitride film 205, the superposed W/$WN_X$ film 204, and the polycrystalline silicon film 203 are etched into a pattern by an anisotropic etching such as RIE (Reactive Ion Etching) to form gate electrodes each including the polycrystalline silicon film 203 and the superposed W/$WN_X$ film 204.

N-type impurity diffusion regions (source/drain region) 206 are formed in an NMOS (N-channel MOS) region of the surface region of the single crystal silicon semiconductor substrate 200, and p-type impurity diffusion regions (source/drain region) 206' are formed in a PMOS (P-channel MOS) region of the surface region of the single crystal silicon semiconductor substrate 200, respectively, by implanting $As^+$ ions, for example, into the NMOS region, and $B^+$ ions, for example, into the PMOS region, and carrying out a heat treatment at 900° C. for 5 seconds.

Further, a silicon nitride film (SiN) 207 is deposited over the surface of the silicon semiconductor substrate 200 to cover the gate electrodes, and then the silicon nitride film 207 is etched back to have a pattern in which a sidewall of the gate electrodes is surrounded by the silicon nitride film 207.

A silicon nitride film (SiN) 208 is deposited over the surface of the silicon semiconductor substrate to cover the gate electrodes (FIG. 6).

Figure 7:
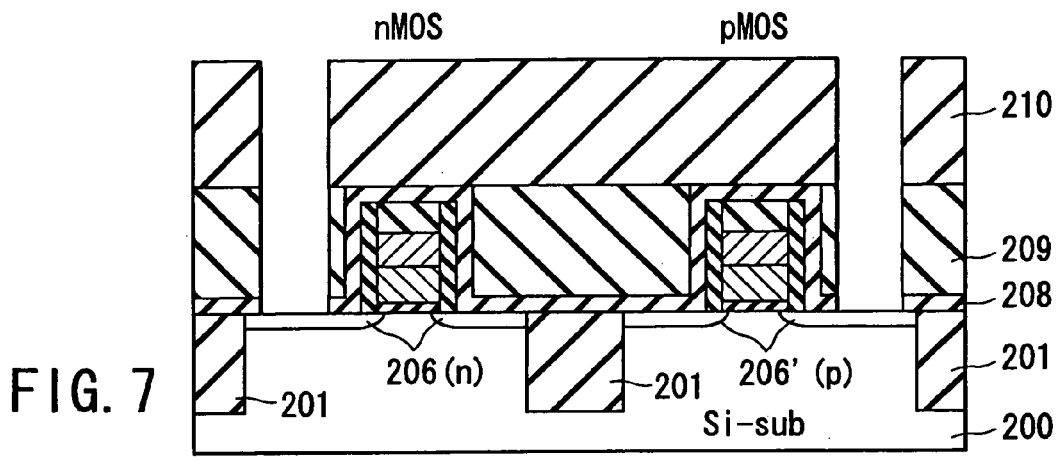
FIG. 7 is a sectional view of the semiconductor device, explaining a step following the step of FIG. 6 of the manufacturing method according to the second embodiment of the present invention.

Then, as shown in FIG. 7, an interlayer insulating film 209 such as a silicon oxide film is deposited over a surface of the silicon nitride film 208, and then the interlayer insulating film 209 is planarized by, e.g. CMP (Chemical Mechanical Polishing) method until the surface of the silicon nitride film 208 is exposed.

An interlayer insulating film 210 such as a silicon oxide film is deposited over the silicon nitride film 208 and the interlayer insulating film 209.

The interlayer insulating films 210 and 209 and the silicon nitride film 208 are anisotropically etched using as a mask a resist pattern, not shown, formed on the interlayer insulating films 210, to form contact holes leading to the impurity diffusion regions 206 and 206' (FIG. 7).

Figure 8:
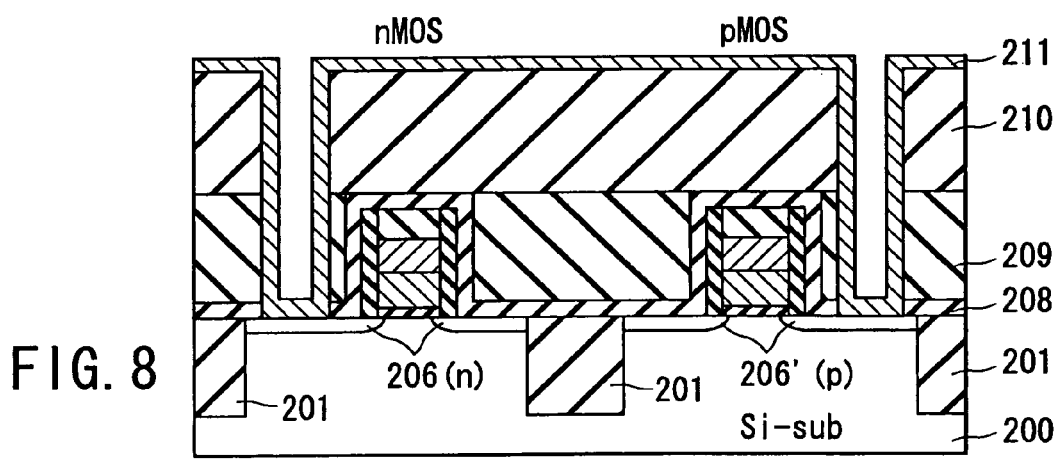
FIG. 8 is a sectional view of the semiconductor device, explaining a step following the step of FIG. 7 of the manufacturing method according to the second embodiment of the present invention.

Then, as shown in FIG. 8, a Ti film 211 having a thickness of, e.g. about 30 nm, is formed over the semiconductor substrate 200 to cover the interlayer insulating films 209 and 210 by sputtering.

Figure 9:
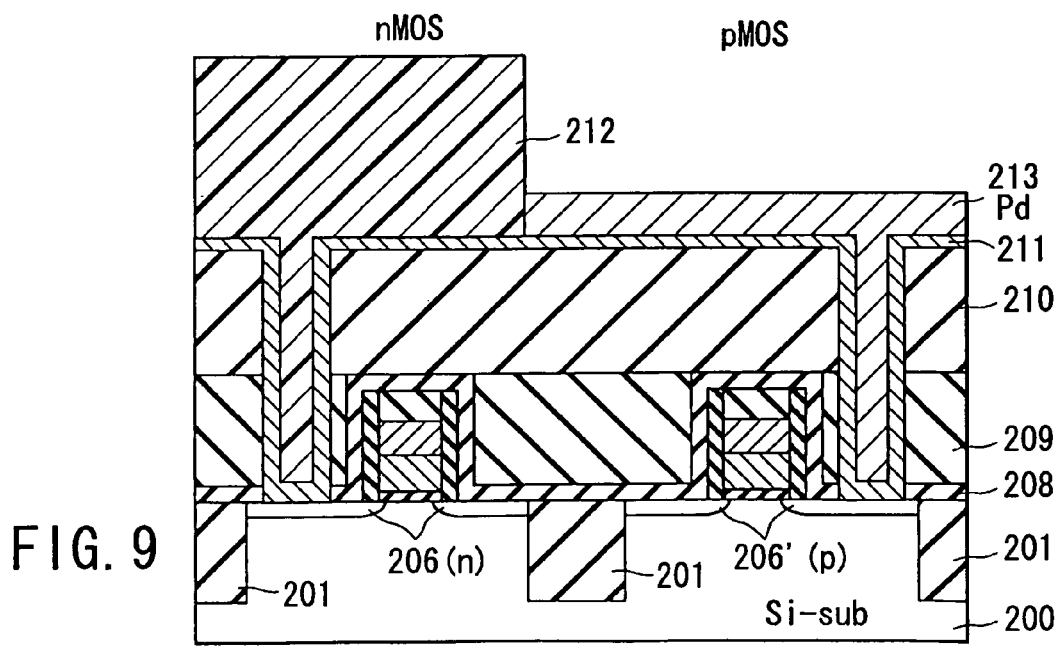
FIG. 9 is a sectional view of the semiconductor device, explaining a step following the step of FIG. 8 of the manufacturing method according to the second embodiment of the present invention.

After that, as shown in FIG. 9, a Pd film 213 is formed over the Ti film 211 in the PMOS region. The Pd film 213 is provided by carrying out electroplating using $PdSO_4$ as a plating solution on conditions that the temperature of a plating tank is in the range of 60 to 80° C., pH of the plating solution is in the range of 1 to 4, and the current density is in the range of 0.2 to 4 A/cm$^2$, while the contact hole in the NMOS region is covered with a resist pattern 212. It is unnecessary to embed Pd in the entire inside of the contact hole.

Figure 10:
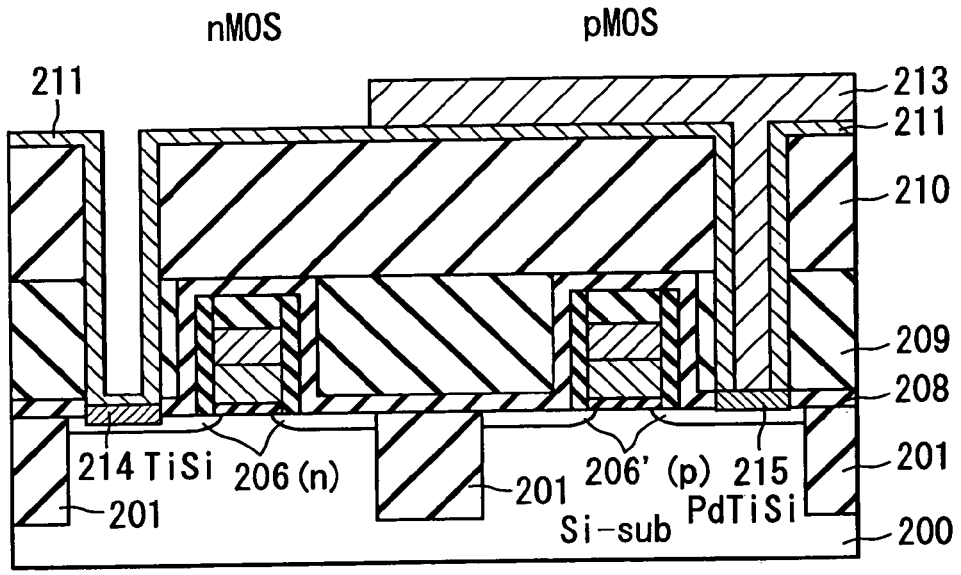
FIG. 10 is a sectional view of the semiconductor device, explaining a step following the step of FIG. 9 of the manufacturing method according to the second embodiment of the present invention.

After forming the Pd film 213 over the Ti film 211 in the PMOS region by carrying out the electroless plating, the resist film 212 is removed, as shown in FIG. 10. After removing the resist film 212, heat treatment is carried out, e.g. at 600° C. for about 90 minutes in an $N_2$ atmosphere. With the heat treatment, as shown in FIG. 10, the titanium silicide layer 214 is formed on the bottom surface of the contact hole in the NMOS region, while a silicide layer 215 of Pd and titanium is formed on the bottom surface of the contact hole in the PMOS region. Since the work function of Pd silicide is large, then the work function of the silicide layer 215 of Pd and Ti becomes larger than that of the titanium silicide layer 214.

Figure 11:
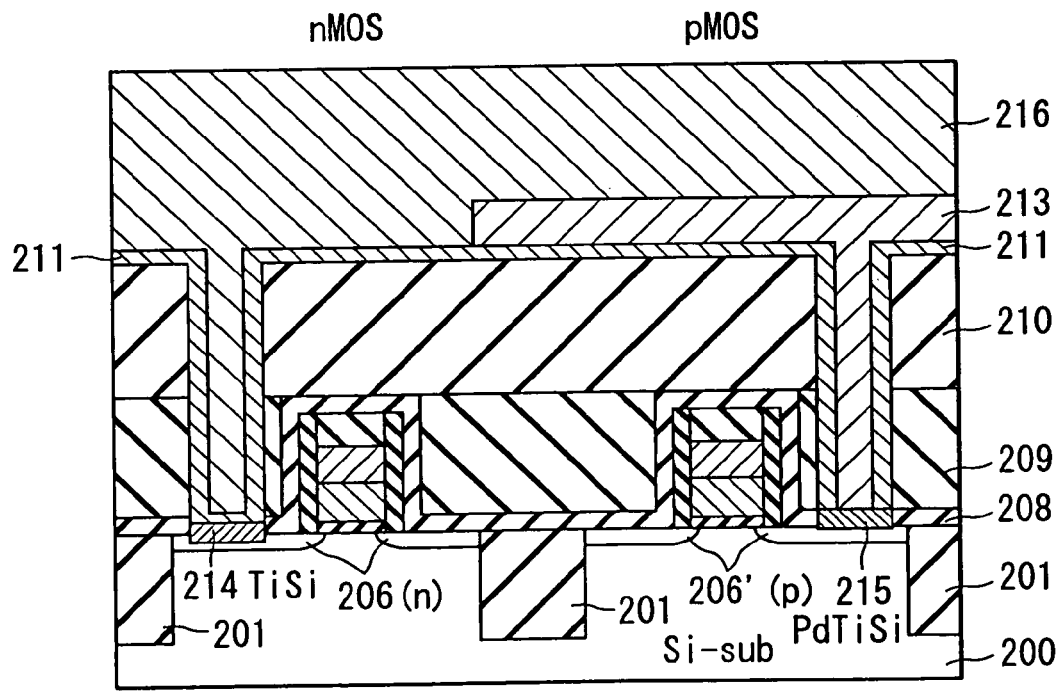
FIG. 11 is a sectional view of the semiconductor device, explaining a step following the step of FIG. 10 of the manufacturing method according to the second embodiment of the present invention.

After carrying out the heat treatment in the $N_2$ atmosphere, thus forming the titanium silicide layer 214 in the NMOS region and the silicide layer 215 of Pd and titanium in the PMOS region, a W (tungsten) film 216 is formed over the titanium film 211 and in the contact holes, as shown in FIG. 11, using $WF_6$, $SiH_4$, and hydrogen as reaction gas.

Figure 12:
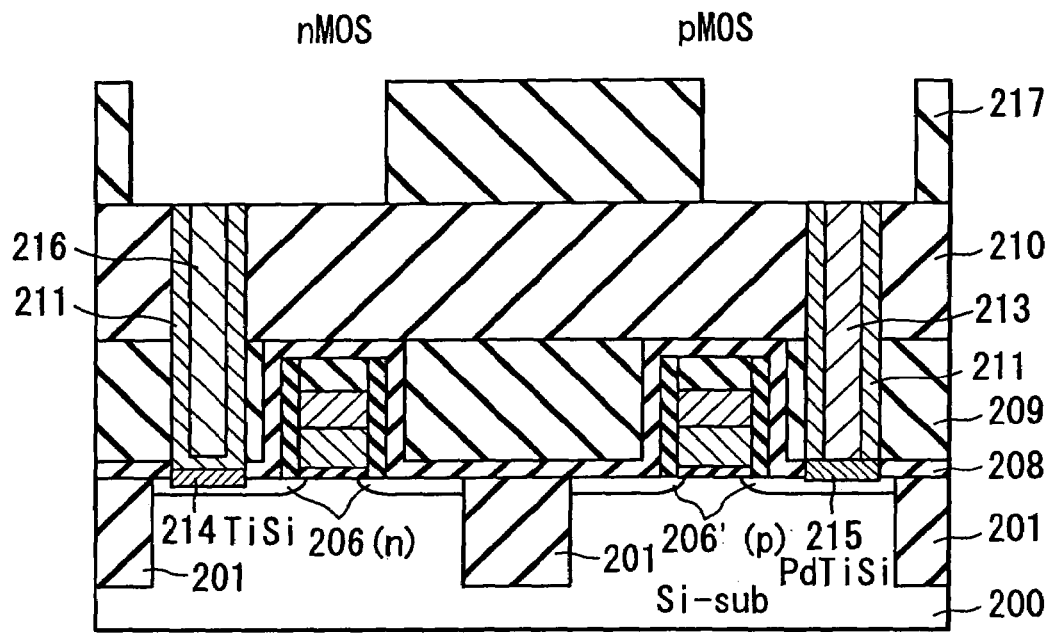
FIG. 12 is a sectional view of the semiconductor device, explaining a step following the step of FIG. 11 of the manufacturing method according to the second embodiment of the present invention.

After that, the W film 216, Pd film 213 and the Ti film 211 are polished by CMP until the surface of the interlayer insulating film 210 is exposed. After that, an interlayer insulating film 217 such as an silicon oxide film is deposited over the interlayer insulating film 210, and then etched to have a wiring groove pattern, as shown in FIG. 12.

A Ta/TaN superposed film 218 and a Cu film 219 are deposited over the interlayer insulating film 217 in the order to be embedded in the wiring grooves. The Ta/TaN superposed film 218 and a Cu film 219 are then polished until the surface of the interlayer insulating film 217 is exposed.

Figure 13:
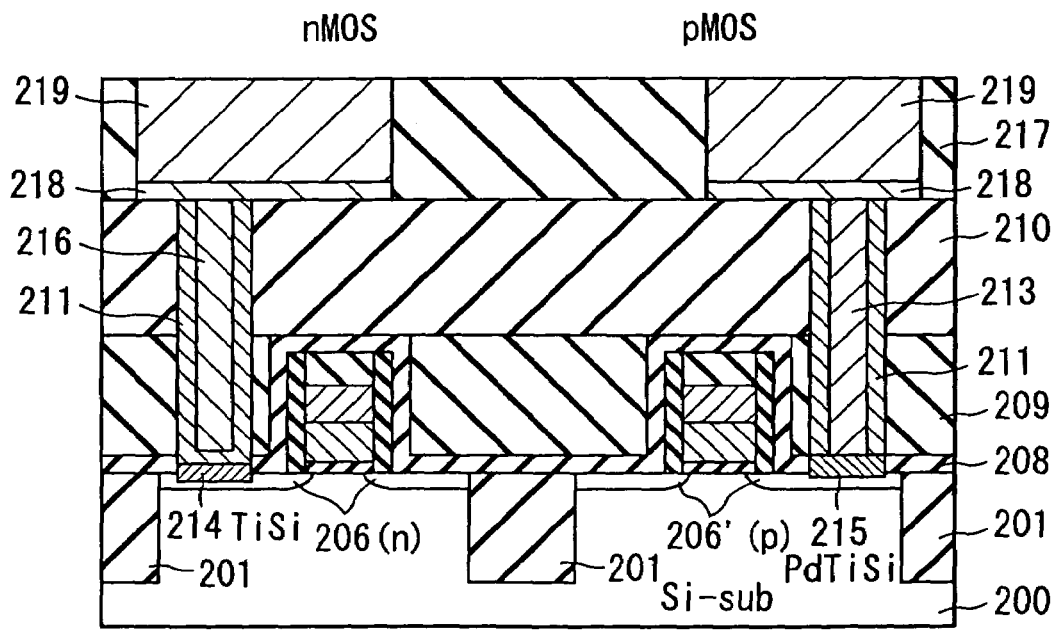
FIG. 13 is a sectional view of the semiconductor device, explaining a step following the step of FIG. 12 of the manufacturing method according to the second embodiment of the present invention.

In this way, the NMOSFET/PMOSFET of the semiconductor substrate 200 are connected to the wiring layers via the contact layers (FIG. 13).

According to this embodiment, it is possible that the work function of the silicide layer of the bottom surface of the contact hole to the p-type semiconductor region (p-type impurity diffusion region 206') is made higher than of the work function of the silicide layer of the bottom surface of the contact hole to the n-type semiconductor region (n-type impurity diffusion region 206), so that the contact resistance on the p-type semiconductor region can be decreased without increasing the contact resistance on the n-type semiconductor region.

A third embodiment of the present invention will be described below referring to FIGS. 14 to 17.

FIGS. 14 to 17 are sectional views of a semiconductor device having a fine contact, explaining steps of a manufacturing method of the third embodiment.

Figure 14:
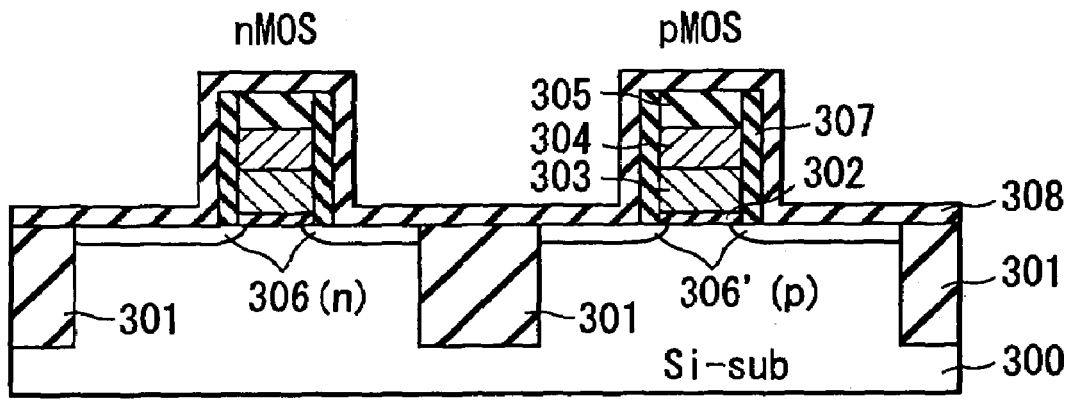
FIG. 14 is a sectional view of a semiconductor device, explaining a step of a manufacturing method according to a third embodiment of the present invention.

First, as shown in FIG. 14, a gate insulating film 302 such as a silicon oxide film is formed on a surface of a single crystal silicon semiconductor substrate 300 in which an element isolating region 301 is formed by, for example, STI (Shallow Trench Isolation).

A polycrystalline silicon film 303 is deposited on the gate insulating film 302 by, e.g. CVD (Chemical Vapor Deposition) method. A superposed $WSi_X$ film 304 is formed on the polycrystalline silicon film 303 by sputtering. A silicon nitride (SiN) film 305 is formed on the superposed $WSi_X$ film 304 by CVD.

The silicon nitride film 305, the superposed $WSi_X$ film 304, and the polycrystalline silicon film 303 are etched into a pattern by an anisotropic etching such as RIE (Reactive Ion Etching) to form gate electrodes each including the polycrystalline silicon film 303 and the superposed $WSi_X$ film 304.

N-type impurity diffusion regions (source/drain region) 306 are formed in an NMOS (N-channel MOS) region of the surface region of the single crystal silicon semiconductor substrate 300, and p-type impurity diffusion regions (source/drain region) 306' are formed in a PMOS (P-channel MOS) region of the surface region of the single crystal silicon semiconductor substrate 300, respectively, by injecting As$^+$ ions, for example, into the NMOS region, and B$^+$ ions, for example, into the PMOS region, and carrying out a heat treatment at 900° C. for 5 seconds.

Further, a silicon nitride film (SiN) 307 is deposited over the surface of the silicon semiconductor substrate 300 to cover the gate electrodes, and then the silicon nitride film 307 is etched back to have a pattern in which a sidewall of the gate electrodes is surrounded by the silicon nitride film 307.

A silicon nitride film (SiN) 308 is deposited over the surface of the silicon semiconductor substrate to cover the gate electrodes (FIG. 14).

Figure 15:
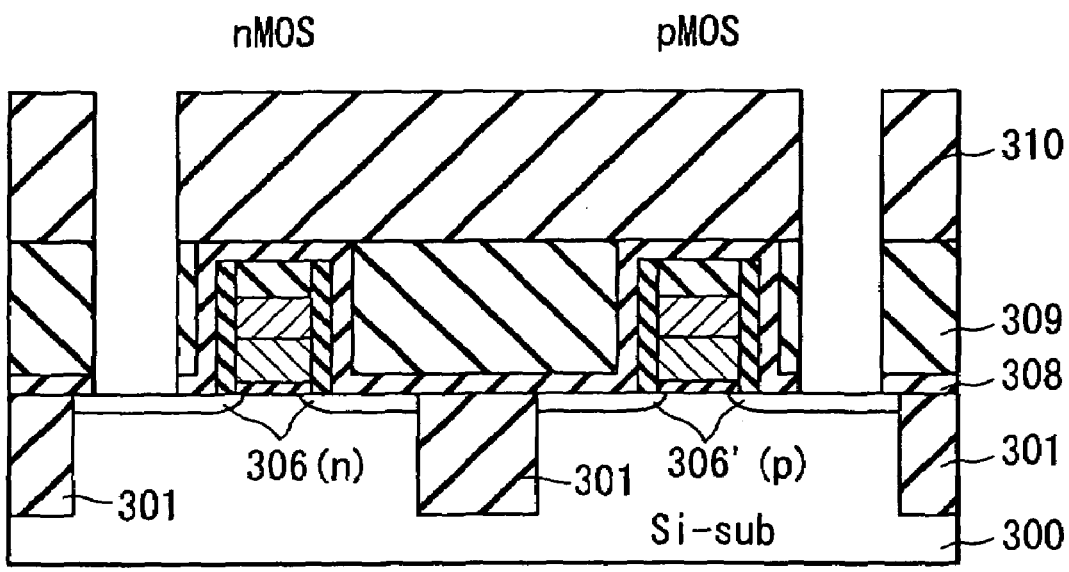
FIG. 15 is a sectional view of the semiconductor device, explaining a step following the step of FIG. 14 of the manufacturing method according to the third embodiment of the present invention.

Then, as shown in FIG. 15, an interlayer insulating film 309 such as a silicon oxide film is deposited over a surface of the silicon nitride film 308, and then the interlayer insulating film 309 is planarized by, e.g. CMP (Chemical Mechanical Polishing) method until the surface of the silicon nitride film 308 is exposed.

An interlayer insulating film 310 such as a silicon oxide film is deposited over the silicon nitride film 308 and the interlayer insulating film 309.

The interlayer insulating films 310 and 309 and the silicon nitride film 308 are anisotropically etched using as a mask a resist pattern, not shown, formed on the interlayer insulating films 310, to form contact holes leading to the impurity diffusion regions 306 and 306' (FIG. 15).

Figure 16:
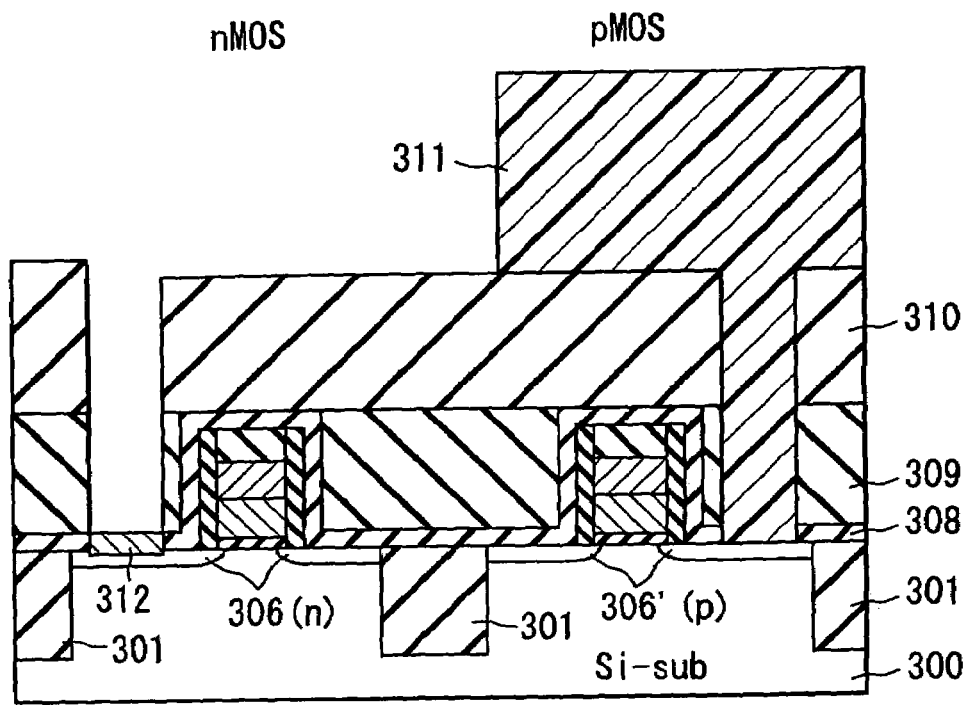
FIG. 16 is a sectional view of the semiconductor device, explaining a step following the step of FIG. 15 of the manufacturing method according to the third embodiment of the present invention.

After that, as shown in FIG. 16, an indium (In) film 312 is formed on the bottom surface of the contact hole in the NMOS region. The In film 312 is provided by carrying out electroless plating, while the contact hole in the PMOS region is covered with a resist pattern 311.

Figure 17:
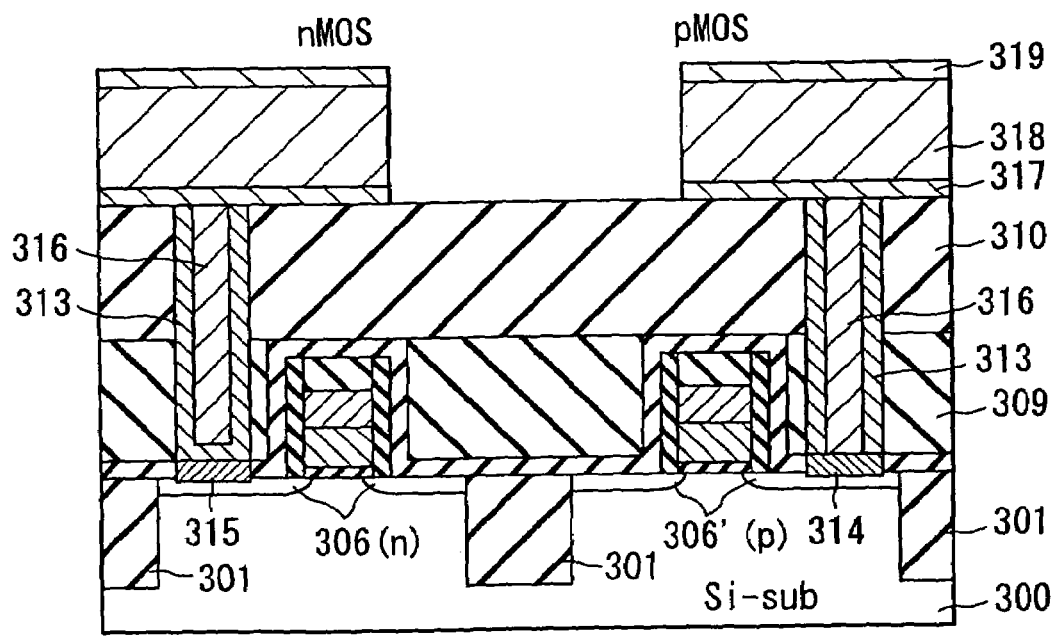
FIG. 17 is a sectional view of the semiconductor device, explaining a step following the step of FIG. 16 of the manufacturing method according to the third embodiment of the present invention.

After forming the In film 312 on the bottom surface of the contact hole in the NMOS region by carrying out the electroless plating, the resist film 311 is removed. After removing the resist film 311, as shown in FIG. 17, an W (tungsten) film 313 having a film thickness of, e.g. about 30 nm, is formed by sputtering. Then, the heat treatment is carried out, e.g. at 550° C. for about 60 minutes in an $H_2/N_2$ atmosphere.

With the heat treatment, the silicide layer 315 of In and W is formed on the bottom surface of the contact hole in the NMOS region, while a tungsten silicide layer 314 is formed on the bottom surface of the contact hole in the PMOS region.

The work function of tungsten silicide is 4.8 eV, and thus tungsten silicide has ohmic contact to a p-type semiconductor region. On the other hand, tungsten silicide has non-ohmic contact (Schottky junction) to an n-type semiconductor region. Thus, the contact resistance on the n-type impurity diffusion region 306 is larger than that on the p-type impurity diffusion region 306'. However, indium (In) can easily react with silicon even at a temperature of as low as about 300° C., and has a high diffusion coefficient in the silicon semiconductor substrate. Further, it is advantageous that the work function of In is as low as 4.0 eV. That is, since the work function of In is as low as 4.0 eV, then In exist at a high concentration in the boundary region of the semiconductor region/silicide layer. As a result, the work function of the InW silicide layer 315 formed in the NMOS region becomes lower than that of that tungsten silicide layer 314 formed in the PMOS region.

In this embodiment, the In silicide is carried out at the same time when titanium silicide is carried out after the Ti film is formed. However, the Pt silicide may be carried out by the heat treatment or the like after the Pt film is formed.

After carrying out the heat treatment in the $H_2/N_2$ atmosphere, thus forming the InW silicide layer 315 in the NMOS region and the W silicide layer 314 in the PMOS region, a W (tungsten) film 316 is formed over the W film 313 and in the contact holes, using $WF_6$, $SiH_4$, and hydrogen as reaction gas.

After that, the W film 316 and the W film 313 are polished by CMP until the surface of the interlayer insulating film 310 is exposed. In this way, contact layers are formed in the NMOS/PMOS regions.

A titanium nitride film (TiN) 317, an Al film 318 and a titanium nitride film (TiN) 319 are formed in the order over the interlayer insulating films 310, the W film 316 and the W film 313. Subsequently, the titanium nitride film (TiN) 317, the Al film 318 and the titanium nitride film (TiN) 319 are subjected to an anisotropic etching to form wiring layers having a predetermined pattern. In this way, the NMOSFET/PMOSFET are connected to the wiring layers via the contact layers (FIG. 17).

According to this embodiment, it is possible that the work function of the silicide layer of the bottom surface of the contact hole to the n-type semiconductor region (n-type impurity diffusion region 306) is made lower than of the work function of the silicide layer of the bottom surface of the contact hole to the p-type semiconductor region (p-type impurity diffusion region 306'), so that the contact resistance on the n-type semiconductor region can be decreased without increasing the contact resistance on the p-type semiconductor region.

In this embodiment, indium (In) is used as the material having the work function not higher than 4.3 eV. However, Ga and Tl and a mixture of these materials may be used.

Further, in this embodiment, indium (In) is formed at the contact of the NMOS region by plating. However, metal films having the work functions suitable for the NMOS region and PMOS region respectively may be formed by combining the Pt plating used in the first embodiment.

According to the embodiments above-described of the present invention, the contact resistance on the p-type semiconductor region can be decreased without increasing the contact resistance on the n-type semiconductor region. Further, the contact resistance can be controlled without increasing the number of processes.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device, comprising:
   a silicon semiconductor substrate;
   a complementary type MISFET circuit including an n-channel MISFET and a p-channel MISFET, which are formed on a surface region of the silicon semiconductor substrate;
   an insulation film formed on the surface region of the silicon semiconductor substrate in which the complementary type MISFET circuit is formed;
   a first contact hole formed in the insulation film, an n-channel impurity diffused region formed at a bottom of the first contact hole;
   a first metal silicide layer formed on the bottom of the first contact hole, the first metal silicide layer being provided by a reaction of the n-channel impurity diffused region with a first metal;
   a second contact hole formed in the insulation film, a p-channel impurity diffused region formed at a bottom of the second contact hole;
   a second metal silicide layer formed on the bottom of the second contact hole, the second metal silicide layer being provided by a reaction of the p-channel impurity diffused region with a second metal; and
   a work function of the second metal silicide layer being higher than that of the first metal silicide layer,
   wherein a first contact layer embedded in the first contact hole comprises the first metal silicide layer formed on the bottom of the first contact hole, a barrier layer formed on a sidewall of the first contact hole, and a metal film formed in the first contact hole to be surrounded by a combination of the first metal silicide layer and the barrier layer.

2. The semiconductor device according to claim 1, wherein the second metal silicide layer formed on the bottom of the second contact hole contains a metal having a work function equal to 4.8 eV or higher than 4.8 eV.

3. The semiconductor device according to claim 2, wherein the metal having a work function equal to 4.8 eV or higher than 4.8 eV comprises at least one element selected from a group consisting of Pt, Pd, Ni, Co, W, Mo, Sb, and Bi.

4. The semiconductor device according to claim 1, wherein the first metal silicide layer formed on the bottom of the first contact hole contains a metal having a work function equal to 4.3 eV or lower than 4.3 eV.

5. The semiconductor device according to claim 4, wherein the metal having a work function equal to 4.3 eV or lower than 4.3 eV comprises In.

6. The semiconductor device according to claim 1, wherein the first metal silicide layer formed on the bottom of the first contact hole contains Ti or Ga.

7. A semiconductor device comprising:
   a silicon semiconductor substrate;
   a complementary type MISFET circuit including an n-channel MISFET and a p-channel MISFET, which are formed on a surface region of the silicon semiconductor substrate;
   an insulation film formed on the surface region of the silicon semiconductor substrate in which the complementary type MISFET circuit is formed;
   a first contact hole formed in the insulation film, an n-channel impurity diffused region formed at a bottom of the first contact hole;
   a first metal silicide layer formed on the bottom of the first contact hole, the first metal silicide layer being provided by a reaction of the n-channel impurity diffused region with a first metal;
   a second contact hole formed in the insulation film, a p-channel impurity diffused region formed at a bottom of the second contact hole;

a second metal silicide layer formed on the bottom of the second contact hole, the second metal silicide layer being provided by a reaction of the p-channel impurity diffused region with a second metal; and a work function of the second metal silicide layer being higher than that of the first metal silicide layer, wherein a second contact layer embedded in the second contact hole comprises the second metal silicide layer formed on the bottom of the second contact hole, a barrier layer formed on a sidewall of the second contact hole, and a metal film formed in the second contact hole to be surrounded by a combination of the second metal silicide layer and the barrier layer.

8. The semiconductor device according to claim 7, wherein the second metal silicide layer formed on the bottom of the second contact hole contains a metal having a work function equal to 4.8 eV or higher than 4.8 eV.

9. The semiconductor device according to claim 8, wherein the metal having a work function equal to 4.8 eV or higher than 4.8 eV comprises at least one element selected from a group consisting of Pt, Pd, Ni, Go, W, Mo, Sb, and Bi.

10. The semiconductor device according to claim 7, wherein the first metal silicide layer formed on the bottom of the first contact hole contains a metal having a work function equal to 4.3 eV or lower than 4.3 eV.

11. The semiconductor device according to claim 10, wherein the metal having a work function equal to 4.3 eV or lower than 4.3 eV comprises In.

12. The semiconductor device according to claim 7, wherein the first metal silicide layer formed on the bottom of the first contact hole contains Ti or Ga.

* * * * *

UNITED STATES PATENT AND TRADEMARK OFFICE
CERTIFICATE OF CORRECTION

PATENT NO. : 7,667,274 B2  Page 1 of 1
APPLICATION NO. : 12/071887
DATED : February 23, 2010
INVENTOR(S) : Nakajima et al.

It is certified that error appears in the above-identified patent and that said Letters Patent is hereby corrected as shown below:

Claim 7, column 12, line 49, change "device comprising:" to --device, comprising:--.

Claim 9, column 14, line 4, change "Go," to --Co,--.

Signed and Sealed this

Twentieth Day of April, 2010

David J. Kappos
*Director of the United States Patent and Trademark Office*